(12) United States Patent
Lenchenkov (10) Patent No.: US 8,542,311 B2
(45) Date of Patent: Sep. 24, 2013

(54) MULTISECTION LIGHT GUIDES FOR IMAGE SENSOR PIXELS

(75) Inventor: Victor Lenchenkov, Sunnyvale, CA (US)

(73) Assignee: Aptina Imaging Corporation, George Town (KY)

( * ) Notice: Subject to any disclaimer, the term of this patent is extended or adjusted under 35 U.S.C. 154(b) by 211 days.

(21) Appl. No.: 13/010,512

(22) Filed: Jan. 20, 2011

(65) Prior Publication Data

US 2012/0188419 A1    Jul. 26, 2012

(51) Int. Cl.
| H04N 5/225 | (2006.01) |
| H04N 9/083 | (2006.01) |
| H04N 3/14 | (2006.01) |
| H01L 31/0232 | (2006.01) |

(52) U.S. Cl.
USPC ........... 348/340; 348/272; 348/294; 257/432; 257/436

(58) Field of Classification Search
USPC ................. 348/272, 273, 280, 294, 302–324, 348/335, 340, 342; 257/432, 436
See application file for complete search history.

(56) References Cited

U.S. PATENT DOCUMENTS

| 3,682,528 | A | 8/1972 | Apfel et al. |
| 5,246,803 | A | 9/1993 | Hanrahan et al. |
| 5,790,188 | A | 8/1998 | Sun |
| 6,108,461 | A | 8/2000 | Haga |
| 6,638,668 | B2 | 10/2003 | Buchsbaum et al. |
| 6,969,899 | B2 | 11/2005 | Yaung et al. |
| 7,358,583 | B2 | 4/2008 | Reznik et al. |
| 2006/0038252 | A1 | 2/2006 | Mouli |
| 2007/0200055 | A1* | 8/2007 | Reznik et al. ............... 250/208.1 |
| 2010/0123811 | A1* | 5/2010 | Abe ............................... 348/294 |
| 2010/0225791 | A1* | 9/2010 | Nakayama ..................... 348/273 |

OTHER PUBLICATIONS

Lenchenkov, U.S. Appl. No. 12/481,068, filed Jun. 9, 2009.
Lenchenkov, U.S. Appl. No. 12/537,128, filed Aug. 6, 2009.

* cited by examiner

*Primary Examiner* — Daniel M Pasiewicz
*Assistant Examiner* — Mark Monk
(74) *Attorney, Agent, or Firm* — Treyz Law Group; G. Victor Treyz; Michael H. Lyons (57) ABSTRACT

Image sensors may contain arrays of image sensor pixels, each of which includes a microlens and a photosensitive element. A multisection light guide that is made up of multiple light guide layers may be interposed between the microlens and the photosensitive element. The light guide layers may have alternating indicies of refraction to form a spectral filter. The lateral dimensions of the light guide layers may also be configured so that the light guide layers perform spectral filtering. Light guide shapes and sizes may be altered as a function of the lateral position of each image sensor pixel within the image sensor array. The uppermost light guide may be aligned with the microlens and the lowermost light guide may be aligned with the photosensitive element. The lateral positions of each light guide may be laterally shifted with respect to the next to form a staggered stack of light guides.

8 Claims, 8 Drawing Sheets

MULTISECTION LIGHT GUIDES FOR IMAGE SENSOR PIXELS

BACKGROUND

This relates generally to image sensors, and more specifically, to light guides for image sensor pixels.

Image sensors are commonly used in electronic devices such as cellular telephones, cameras, and computers to capture images. An image sensor generally contains an array of image sensor pixels. Each image sensor pixel may contain a photosensitive element such as a photodiode. A microlens and light guide may be associated with each image sensor pixel to help concentrate light onto the photosensitive element.

In conventional image sensor pixels, light is sometimes lost due to misalignment between light guides and photosensitive elements. It can also be challenging to form image sensor pixels with desired spectral characteristics.

It would therefore be desirable to be able to provide image sensors with improved performance.

DETAILED DESCRIPTION

Digital camera modules are widely used in electronic devices such as digital cameras, computers, cellular telephones, or other electronic devices. The digital camera modules in these devices include image sensors that receive incoming light and produce a corresponding digital image. The image sensors may include arrays of image sensor pixels. The pixels in the image sensors may include photosensitive elements such as photodiodes that convert the incoming light into digital data signals. Image sensors may have any number of pixels (e.g., hundreds or thousands or more). A typical image sensor may, for example, have millions of pixels (e.g., megapixels). In high-end equipment, image sensors with ten megapixels or more are not uncommon.

Figure 1:
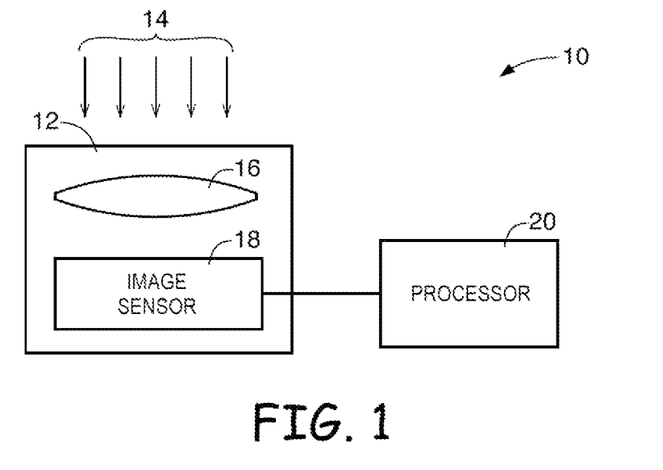
FIG. 1 is a diagram of an imaging system in accordance with an embodiment of the present invention.

FIG. 1 shows an imaging system in accordance with an embodiment of the present invention. As shown in FIG. 1, imaging system 10 may receive incoming image light 14 from an external object. Image light 14 may be received by camera module 12. Lens 16 in camera module 12 may focus image light 12 onto image sensor 18. Image sensor 18 may contain an array of image sensor pixels that convert the image light into digital image data. The digital image data may be processed by image processing circuitry 20. Circuitry 20 may be incorporated into camera module 12 and/or may be implemented using external processing circuitry (e.g., a microprocessor, an application-specific integrated circuit, etc.).

Figure 2:
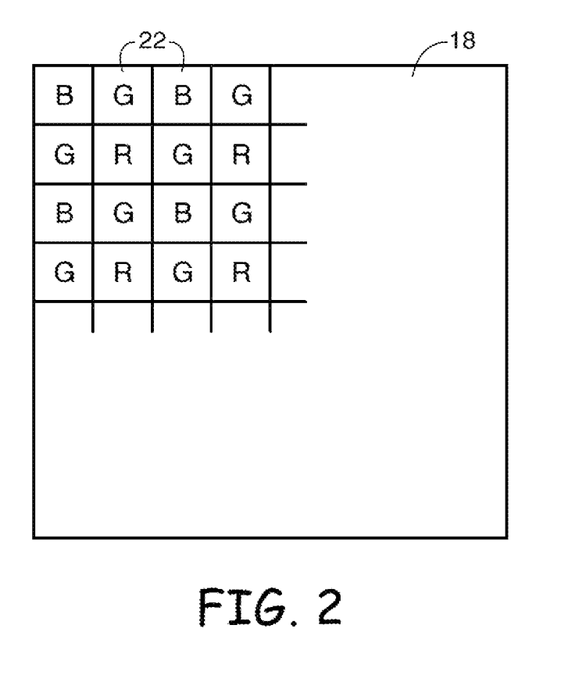
FIG. 2 is a top view of an image sensor showing how the image sensor may be provided with a pattern of color filter elements in a color filter array in accordance with an embodiment of the present invention.

To provide image sensor 18 with the ability to sense colors, sensor 18 may be provided with a color filter. An illustrative pattern that may be used for the color filter elements in the color filter is shown in FIG. 2. As shown in the example of FIG. 2, the image sensor pixel array of sensor 18 may be associated with a pattern of color filter elements 22 in which blue (B) elements alternate with green (G) elements in some rows and in which green (G) elements alternate with red (R) elements in other rows. A color filter array of the type shown in FIG. 2 may be used to ensure that the image sensor pixels in array 18 (each of which is associated with a respective one of color filter elements 22) are in color, rather than black and white (grayscale). This is merely illustrative. Image sensor 18 may, if desired, be a grayscale sensor. Arrangements in which image sensor 18 is a color-sensitive image sensor are sometimes described herein as an example.

Figure 3:
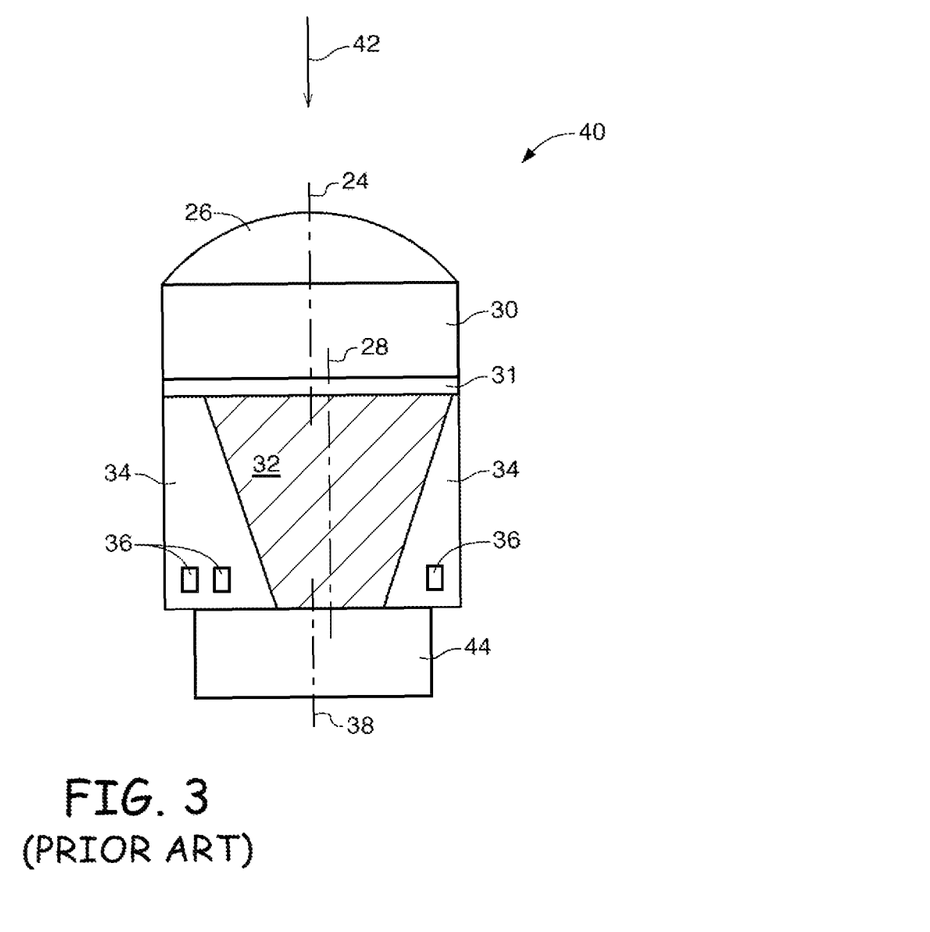
FIG. 3 is a cross-sectional side view of a conventional image sensor pixel showing how a light guide in the image sensor pixel may be misaligned with respect to a photosensitive element in the image sensor pixel.

A conventional image sensor pixel is shown in FIG. 3. As shown in FIG. 3, image sensor pixel 40 may receive incoming light (e.g., from a focusing lens) using microlens 26. Microlens 26 may help concentrate light 42 to improve the efficiency of the image sensor. Color filter 30 (which may be formed on top of silicon nitride passivation layer 31) is used to provide color filtering capabilities to image sensor pixel 40. Light that has passed through microlens 26 and color filter layer 30 may be conveyed to photosensitive element 44 using light guide 32. Light guide 32 is surrounded by silicon oxide 34. The index of refraction of light guide 32 (e.g., n=1.6) is greater than the index of refraction of silicon oxide 34 (n=1.46), so light is guided in light guide 32 according to the principal of total internal reflection. Interconnects 36 may be associated with the circuitry of image sensor pixel 40 and may be contained in dielectric stack layers such as a contact layer, a metal 1 layer, a metal 2 layer, etc.

Microlens 26 has a central axis 24. To accommodate an asymmetrical component layout in image sensor pixel 40 (as illustrated by the asymmetric layout of the metal traces 36 in the configuration of FIG. 3), light guide 32 is shifted so that center axis 28 of light guide 32 is not aligned with center axis 24 of microlens 26 and is not aligned with respect to center axis 38 of photosensitive element 44. This misalignment tends to reduce the amount of light 42 that reaches photosensitive element 44 and therefore degrades sensor performance.

Figure 4:
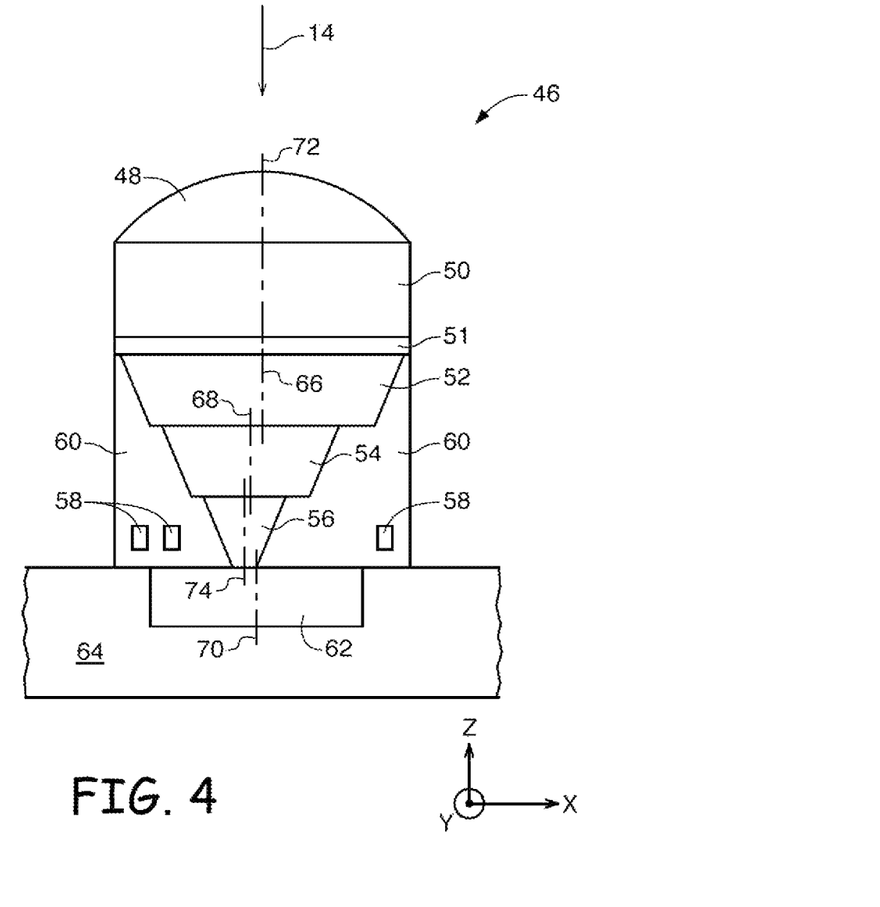
FIG. 4 is a cross-sectional side view of an image sensor pixel with a staggered multisection light guide of the type that may be used to improve light gathering efficiency for a photosensitive element in accordance with an embodiment of the present invention.

An image sensor pixel in accordance with an embodiment of the present invention is shown in FIG. 4. As shown in FIG. 4, incoming light 14 may be received by microlens 48. Color filter 50 (e.g., a blue, green, or red color filter element) may be used to filter light 14.

To improve the efficiency with which light is conveyed from microlens 48 to photosensitive element 62, a multisection light guide configuration may be used in which there are two or more light guides associated with each pixel. The light guides (which are sometimes referred to as light guide layers) may, if desired, have tapered sides to help concentrate light onto photosensitive element 62.

In the example of FIG. 4, there are three light guides interposed between color filter 50 and photosensitive element 62—upper light guide 52, middle light guide 54, and lower light guide 56. Microlens 48 may be formed from a polymer. Color filter 50 may be formed from a polymer layer with an added color pigment. Passivation layer 51 may be formed from a material such as silicon nitride that helps prevent impurities such as sodium from penetrating the underlying structure in image sensor pixel 46. Light guides such as light guides 52, 54, and 56 may be formed from polymer (e.g., polyimide) and may have an index of refraction that is larger than that of surrounding layer 60 to promote total internal reflection of the light being conveyed vertically through the light guide layers. For example, light guides 52, 54, and 56 may have an index or refraction of 1.6 (as an example), whereas layer 60 may be formed from silicon oxide and may have an index of refraction of 1.46 (as an example).

Each light guide in image sensor pixel 46 may be staggered (laterally shifted in dimension X) with respect to the next, as shown in FIG. 4. Light first passes through upper light guide 52, then passes through intermediate light guide 54 and lower light guide 56. The circuitry of image sensor pixel 46 (e.g., the transistors and photosensitive element 62 in pixel 46) may be interconnected using one or more layers of interconnects (illustrated by interconnects 58 and surrounding dielectric 60). Interconnects 58 may be formed in metal layers in a dielectric stack such as a contact layer, a metal 1 layer, a metal 2 layer, etc. Dielectric 60 may be a dielectric such as silicon dioxide. The narrow shapes and tapers of the lower-level light guides in the multisection light guide arrangement of FIG. 4 may help accommodate interconnects 58.

As light 14 passes through each light guide layer in dimension Z, the light is slightly shifted in lateral dimensions X and Y. This allows the light to gradually transition from being in lateral alignment with central axis 72 of microlens 48 to central axis 70 of photosensitive element 62. As shown in FIG. 4, central axis 72 of microlens 48 may be aligned with central axis 66 of the uppermost light guide (i.e., light guide 52) to maximize the amount of light that is received from microlens 48 by the uppermost light guide. Light guide 54 may be positioned so as to be slightly off center with respect to light guide 52 (i.e., central axis 68 of middle light guide 54 may be slightly laterally shifted (in dimension X and/or Y) and therefore misaligned with respect to center axis 66 of upper light guide 52. Lower light guide 56 may be laterally shifted so that center axis 74 of light guide 56 is in alignment with center axis 70 of photosensitive element 62, while being misaligned (laterally shifted) with respect to center axis 68 of middle light guide 54. Photosensitive element 62 may be a photodiode or other suitable semiconductor detector formed in semiconductor substrate 64. Semiconductor substrate 64 may be, for example, a silicon substrate.

The fraction of incoming light 14 that is received by photosensitive element 62 (i.e., light reception efficiency) is enhanced by the alignment of light guide 52 with respect to microlens 48 and by the alignment of light guide 56 with respect to photosensitive element 62. Middle light guide 54 serves as an interface between the upper and lower light guides and helps smooth the transition between light guides 52 and 56 and thereby enhance light reception efficiency. If desired, light guide 52 may be slightly misaligned with respect to microlens 48 (and color filter 50) and/or light guide 56 may be slightly misaligned with respect to photosensitive element 62. The arrangement of FIG. 4 is merely illustrative.

Figure 5:
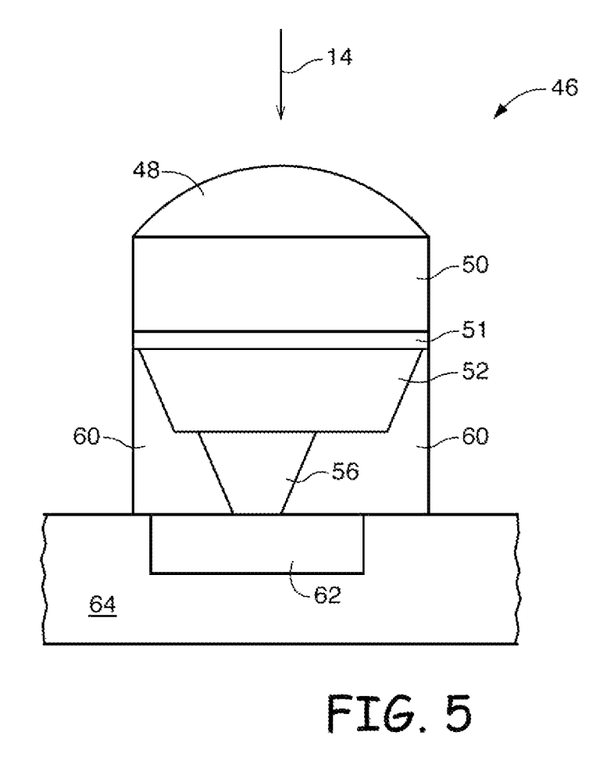
FIG. 5 is a cross-sectional side view of an image sensor pixel with a two-section staggered light guide in accordance with an embodiment of the present invention.

If desired, the light guide structures in image sensor pixel 46 may be provided with more than three light guide layers or fewer than three light guide layers. The illustrative arrangement of FIG. 5, for example, contains two light guide layers: upper light guide layer 52 and lower light guide layer 56, but no intermediate light guide layer.

Figure 6:
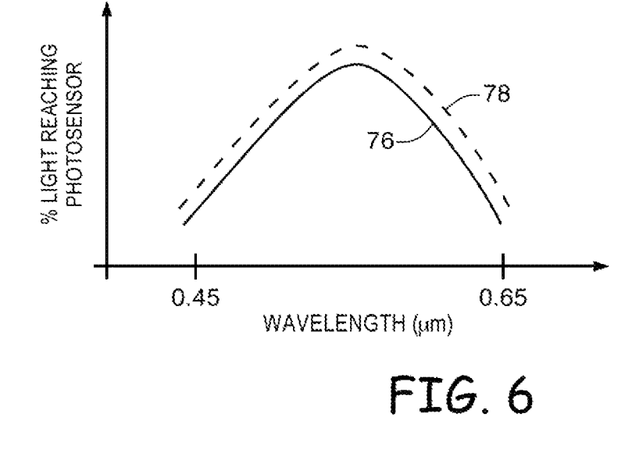
FIG. 6 is a graph showing how multisection light guides may route an enhanced amount of light to a photosensitive element in an image sensor pixel in accordance with an embodiment of the present invention.

The graph of FIG. 6 shows how the amount of light that reaches photosensitive element 64 may increase by using multisection light guides in place of a single-section light guide. In the graph of FIG. 6, light collection at photosensitive element 62 has been plotted as a function of wavelength across a normal range of wavelengths suitable for image sensor 18. Solid line 76 corresponds to light collected at the photosensitive element using a conventional single light guide image sensor pixel structure of the type shown in FIG. 3. Dashed line 78 corresponds to light collected at the photosensitive element using a multisection light guide of the type shown in FIG. 4 or FIG. 5. As shown in the graph, more light is collected using the multisection light guide than using the single layer light guide of conventional image sensor pixel 40 of FIG. 3.

Figure 7:
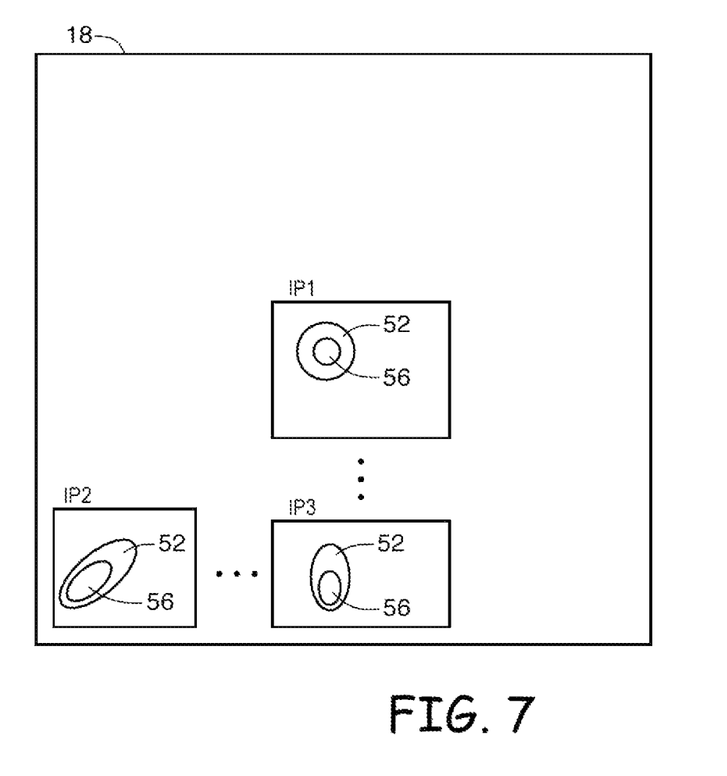
FIG. 7 is a top view of an image sensor showing how the point spread function of an imaging lens may be accommodated by forming multisection light guide structures of different shapes in different locations on the image sensor in accordance with an embodiment of the present invention.

Light guides in a multisection (multilayer) light guide image sensor pixel may have any suitable shapes (e.g., circles, squares, ovals, shapes with combinations of curved and straight sides, etc.). If desired, the size and shape of the light guides may be varied as a function of lateral (X, Y) position within image sensor 18. As shown in FIG. 7, for example, in image sensor pixels such as image sensor pixel IP1 in the center of sensor 18 may be provided with circular light guides. The upper light guide (light guide 56) may have a larger diameter than the lower light guide, as shown in FIG. 4. At the corners of sensor 18, image sensor pixels such as image sensor pixel 1P2 may have oval shaped light guides (e.g., with upper light guide 52 having both major and minor axis that are larger than the corresponding axes of lower light guide 56). Edge pixels such as image sensor pixel IP3 in the FIG. 7 example may likewise be provided with laterally elongated light guide shapes. Use of an arrangement of the type shown in FIG. 7 may help image sensor 18 accommodate the point spread function of lens 16 (e.g., by ensuring that pixels near the edges of sensor 18 have elongated light guides that help gather image light that has been spread out due to its peripheral location in sensor 18).

Figure 8:
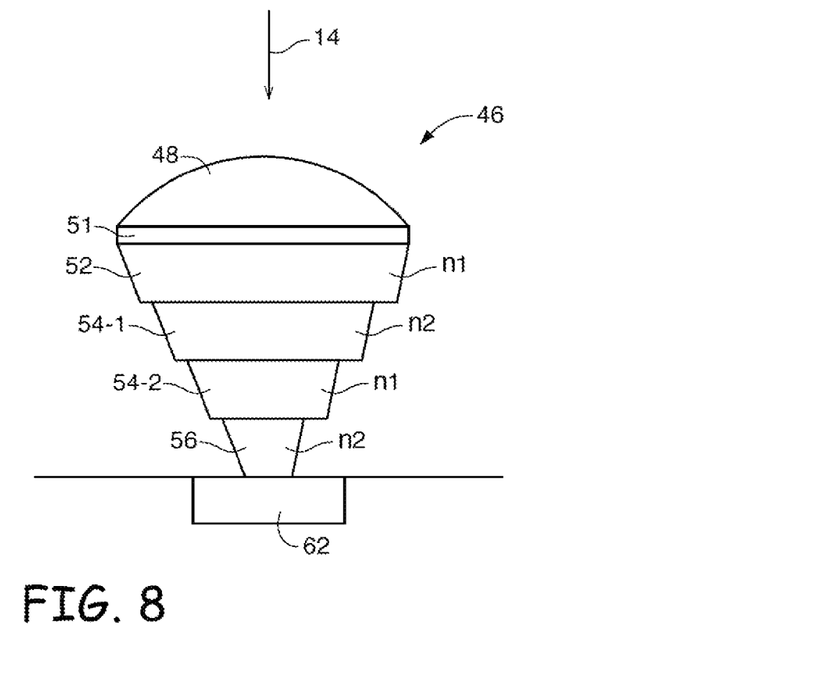
FIG. 8 is a cross-sectional side view of an illustrative image sensor pixel with a multisection light guide that includes alternating high-index-of-refraction and low-index-of-refraction layers to implement spectral filtering in accordance with an embodiment of the present invention.

If desired, some or all of color filter 50 may be omitted by forming the filter for the image sensor pixel as an integral portion of the light guide structures. As shown in FIG. 8, for example, image sensor pixel 46 may be provided with light guides 52, 54-1, 54-2, and 56 that are interposed between microlens 48 (and passivation layer 51) and photosensitive element 62. A Bragg filter may be implemented by selection of appropriate indicies of refraction for the light guides. As an example, the light guides may have alternating high and low indicies of refraction. Light guides 52 and 54-2 may, for example, have an index of refraction of 2.2, whereas light guides 54-1 and 56 may have an index or refraction of 1.6. Examples of materials that may be used to form light guide layers with an index of refraction of about 2.2 include silicon nitride, silicon carbide, and metal oxides such as titanium oxide. Examples of materials that may be used to form light guide layers with an index of refraction of about 1.6 include silicon oxynitride, polyimide, etc. These are merely illustrative examples. Other layers of material may be used in forming light guides if desired. Moreover, the stack of light guide layers may have more than two different indicies of refraction (e.g., three or more different indicies, four or more, etc.). The illustrative configuration of FIG. 8 in which a high-low stack of light guide layers is used to implement a spectral filter for image sensor pixel 46 is provided as an example.

Figure 9:
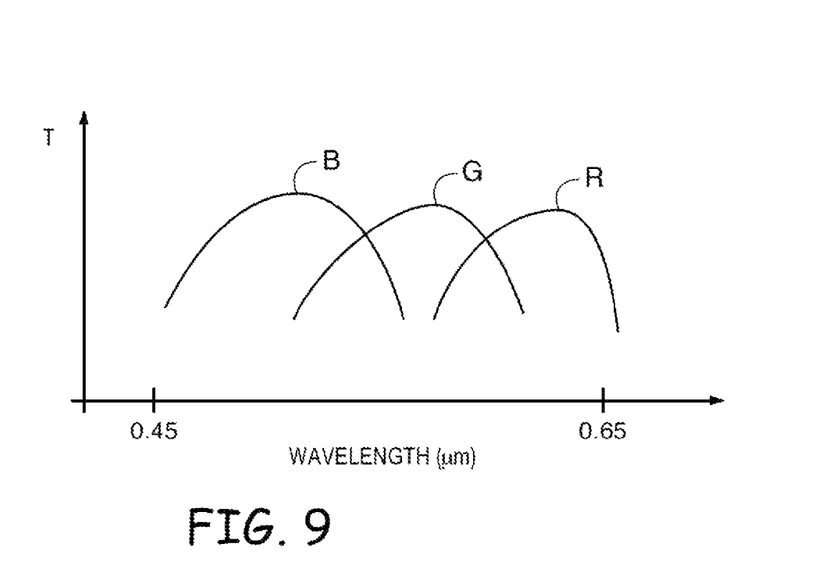
FIG. 9 is a graph in which the spectral response of several multisection light guide filters of the type shown in FIG. 8 have been plotted in accordance with an embodiment of the present invention.

FIG. 9 is a graph showing how different integral light-guide filters of the type shown in FIG. 8 may be used in creating an array of red, blue, and green filters for image sensor 18. In the graph of FIG. 9, the transmission of the stack of light guide layers in the multisection light guide has been plotted as a function of wavelength for three different image sensor pixel structures of the type shown in FIG. 8. The line labeled "B" corresponds to an image sensor pixel in which the multisection light guide has been used to implement a bandpass filter centered at blue wavelengths. The lines labeled "G" and "R" correspond to image sensor pixels whose light guide stacks have been configured to implement green and red bandpass filters, respectively. Other configurations may be used (e.g., with low pass filters, high pass filter, notch filters, filters at different wavelengths, filters with different spectral shapes and bandwidths, etc.). Because the light guides in the image sensor pixel perform desired spectral filtering functions, color filter layers based on pigmented polymer (e.g., color filter 50 of FIG. 4) may be partly or completely omitted. Image sensor pixels with integral color filtering properties may be used to form an array such as the image sensor array of FIG. 2 or other suitable image sensor pattern.

If desired, an image sensor pixel may be provided with light guide structures that form a filter without using layers with different indicies of refraction. Consider, as an example, the arrangement of FIG. 10. In image sensor pixel 46 of FIG. 10, red light RL (represented by the solid line) and blue light BL (represented by the dashed line) is incident on microlens 48 and passivation layer 51. Lines RL and BL show how red light and blue light are affected differently as they pass through light guides 52, 54, and 56.

Figure 10:
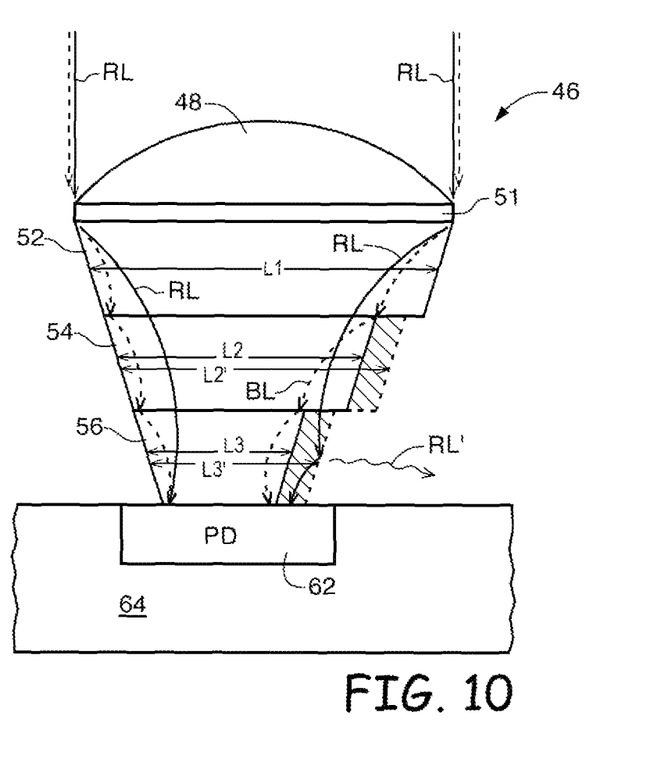
FIG. 10 is a cross-sectional side view of an illustrative image sensor pixel showing how use of light guide layers with different lateral dimensions may be used in implementing spectral filtering in the image sensor pixel in accordance with an embodiment of the present invention.

There are two possible light guide configurations in the example of FIG. 10.

In the first configuration of the light guide in FIG. 10, the lateral dimensions of light guides 52, 54, and 56 are L1, L2, and L3, respectively. In this configuration, some of red light RL can escape from the light guide, as indicated by light RL'. The propagation path for blue light BL does not cause blue light BL to escape. As a result, blue light transmission is greater than red light transmission (i.e., the light guide of pixel 46 functions as a blue-pass filter).

In the second configuration of the light guide of FIG. 10, light guides 52, 54, and 56 have respective lengths of L1, L2', and L3' (i.e., the shaded portion of the light guides in FIG. 10 is present). Because light guides 54 and 56 have different (larger) lateral sizes, the propagation paths for the blue and red light passing through the light guide is altered. In particular, red light is allowed to propagate into photosensitive element 62 along path RL", rather than leaking out of the light guide. As a result, image sensor pixel 46 in the second configuration may operate as a red-passing filter.

Figure 11:
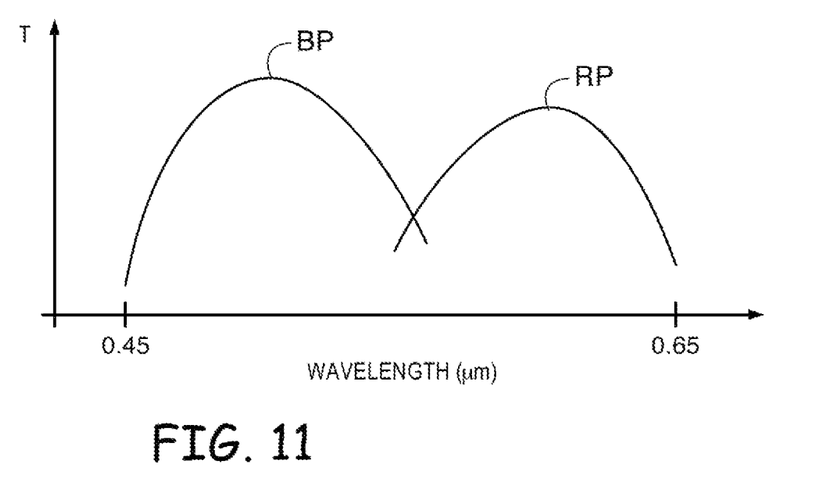
FIG. 11 is a graph in which light guide transmission has been plotted as a function of wavelength for a pair of image sensor pixel structures with different lateral dimensions to implement a filtering scheme of the type shown in FIG. 10 in accordance with the present invention.

FIG. 11 is a graph showing the transmission of the light guide of image sensor pixel 46 of FIG. 10 in both the first and second configurations. In the configuration where light guides 54 and 56 are narrower, the light guide stack exhibits a transmission (T) versus wavelength characteristic of the type shown by curve BP. In the configuration where light guides 54 and 56 are wider, the light guide stack of image sensor pixel 46 of FIG. 10 exhibits a transmission versus wavelength characteristic of the type shown by curve RP. A green-pass filter may likewise be constructed by choosing lateral dimensions for the light guides that are appropriate for green light.

Combinations of the integral filtering arrangements and position-dependent light guide shape arrangements may be used in image sensor 18 if desired. For example, multisection light guides may be formed that use alternating high and low indicies of refraction for implementing a Bragg filter while simultaneously using the width adjustment light guide arrangement of FIG. 10 to give rise to additional or different filtering characteristics.

Various embodiments have been described illustrating how image sensor pixels in an array may be constructed using multisection light guides. In the multisection light guides, multiple light guides may be stacked in a staggered fashion between a photosensitive element on an integrated circuit substrate and overlapping structures such a passivation layer, optional color filter, and microlens. Integral spectral filtering for an image sensor can be implemented using alternating light guide layers of high and low index of refraction material or using light guide with lateral dimensions that are chosen to affect the spectral transmittance of the light guide stack.

The foregoing is merely illustrative of the principles of this invention which can be practiced in other embodiments.

What is claimed is:

1. An image sensor having an array of image sensor pixels, wherein each image sensor pixel is at a respective lateral location in the array of image sensor pixels and wherein each image sensor pixel comprises:
   a photosensitive element;
   a microlens associated with the photosensitive element; and
   a stack of light guides interposed between the microlens and the photosensitive element, wherein each light guide in the stack of light guides has different lateral dimensions and are laterally misaligned with respect to each other, wherein each light guide in the stack of light guides has a shape that is dependent on the lateral location of the associated image sensor pixel within the array of image sensor pixels.

2. The image sensor defined in claim 1 wherein the light guides include an upper light guide, wherein the microlens has a center axis, wherein the upper light guide has a center axis, and wherein the center axis of the microlens is aligned with the center axis of the upper light guide.

3. The image sensor defined in claim 2 wherein the stack of light guides includes a lower light guide that is adjacent to the photosensitive element, wherein the photosensitive element has a center axis, wherein the lower light guide has a center axis, and wherein the center axis of the photosensitive element is aligned with the center axis of the lower light guide.

4. An image sensor having an array of image sensor pixels, wherein each image sensor pixel comprises:
   a photosensitive element;
   a microlens associated with the photosensitive element;
   and a stack of light guides interposed between the microlens and the photosensitive element, wherein each light guide in the stack of light guides have different lateral dimensions and are laterally misaligned with respect to each other, wherein each light guide in the stack of light guides has a shape that is dependent on its lateral location within the array of image sensor pixels, wherein the array of image sensor pixels comprises at least a first image sensor pixel and a second image sensor pixel, and wherein each light guide of the first image sensor pixel is an oval shaped light guide.

5. The image sensor defined in claim 1, wherein the array of image sensor pixels comprises at least a first image sensor pixel and a second image sensor pixel, wherein each light guide of the first image sensor pixel and the second image sensor pixel is an oval shaped light guide.

6. An image sensor having an array of image sensor pixels, wherein each image sensor pixel comprises:
   a photosensitive element;
   a microlens associated with the photosensitive element; and a stack of light guides interposed between the microlens and the photosensitive element, wherein each light guide in the stack of light guides have different lateral dimensions and are laterally misaligned with respect to each other, wherein each light guide in the stack of light guides has a shape that is dependent on its lateral location within the array of image sensor pixels, wherein the array of image sensor pixels comprises at least a first image sensor pixel and a second image sensor pixel, wherein at least one light guide of the first image sensor pixel is a first oval shaped light guide having a first major axis, wherein at least one light guide of the second image sensor pixel is a second oval shaped light guide having a second major axis, and wherein the first major axis is angled with respect to the second major axis.

7. The image sensor defined in claim 1, wherein the array of image sensor pixels comprises at least a first image sensor pixel and a second image sensor pixel, wherein each light guide of the first image sensor pixel is a circle shaped light guide.

8. The image sensor defined in claim 7, wherein each light guide of the second image sensor pixel is an oval shaped light guide.

* * * * *